United States Patent
Ohmura et al.

(10) Patent No.: US 8,648,246 B2
(45) Date of Patent: Feb. 11, 2014

(54) THERMOELECTRIC MODULE AND POWER GENERATION APPARATUS

(75) Inventors: Mio Ohmura, Yokohama (JP); Jun Karasawa, Tokyo (JP); Naruhito Kondo, Kawasaki (JP); Osamu Tsuneoka, Tokyo (JP); Yasuhito Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 395 days.

(21) Appl. No.: 13/009,361

(22) Filed: Jan. 19, 2011

(65) Prior Publication Data

US 2011/0247670 A1 Oct. 13, 2011

(30) Foreign Application Priority Data

Jan. 19, 2010 (JP) .................................. 2010-009492
Dec. 16, 2010 (JP) .................................. 2010-280313
Jan. 13, 2011 (JP) .................................. 2011-005260

(51) Int. Cl.
*H01L 35/30* (2006.01)
*H01L 35/28* (2006.01)

(52) U.S. Cl.
USPC .......................................... 136/205; 136/212

(58) Field of Classification Search
USPC .................................................. 136/212, 205
See application file for complete search history.

(56) References Cited

U.S. PATENT DOCUMENTS

2008/0236174 A1* 10/2008 Tanielian .......................... 62/3.2

OTHER PUBLICATIONS

Kim, S.S. et al., "Thermoelectricity for crystallographic anisotropy controlled Bi—Te based alloys and p-n modules", Nov. 22, 2006, Journal of Alloys and Compounds 419, pp. 306-311.*
Robert W. Diller et al., "Experimental Results Confirming Improved Efficiency of Thermoelectric Power Generation Systems with Alternate Thermodynamic Cycles," Proceedings of the 22nd International Conference on Thermoelectrics, Aug. 2003, 3 pages.

* cited by examiner

*Primary Examiner* — Tamir Ayad
(74) *Attorney, Agent, or Firm* — Oblon, Spivak, McClelland, Maier & Neustadt, L.L.P.

(57) ABSTRACT

According to one embodiment, a thermoelectric module includes a housing and a power generation member. The housing has a first temperature layer and a second temperature layer, the first temperature layer and the second temperature layer being stacked, the housing further having a cylindrical through-hole provided so as to penetrate the first temperature layer and the second temperature layer. The power generation member has thermoelectric materials stacked such that current flows in one direction in the power generation member, the power generation member being provided in the through-hole so that opposite ends of each of the thermoelectric materials are positioned at the first temperature layer and the second temperature layer, respectively.

18 Claims, 17 Drawing Sheets

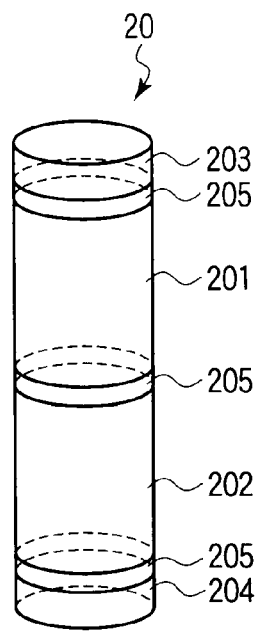
F I G. 5
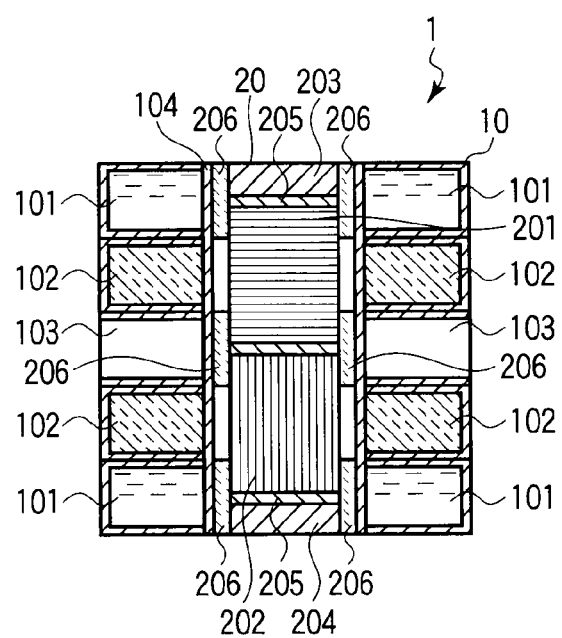
F I G. 6

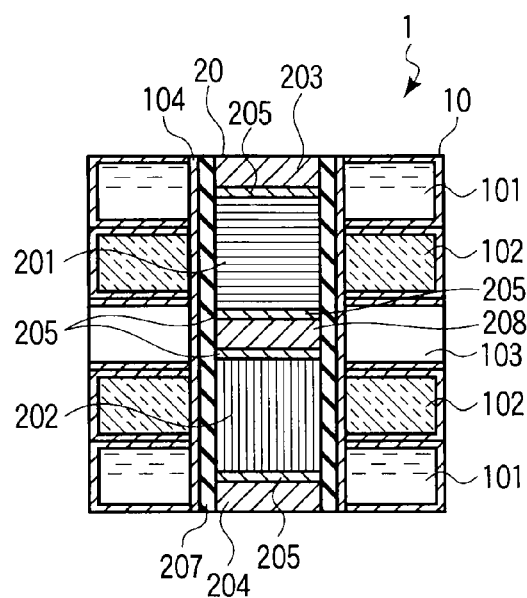
F I G. 11
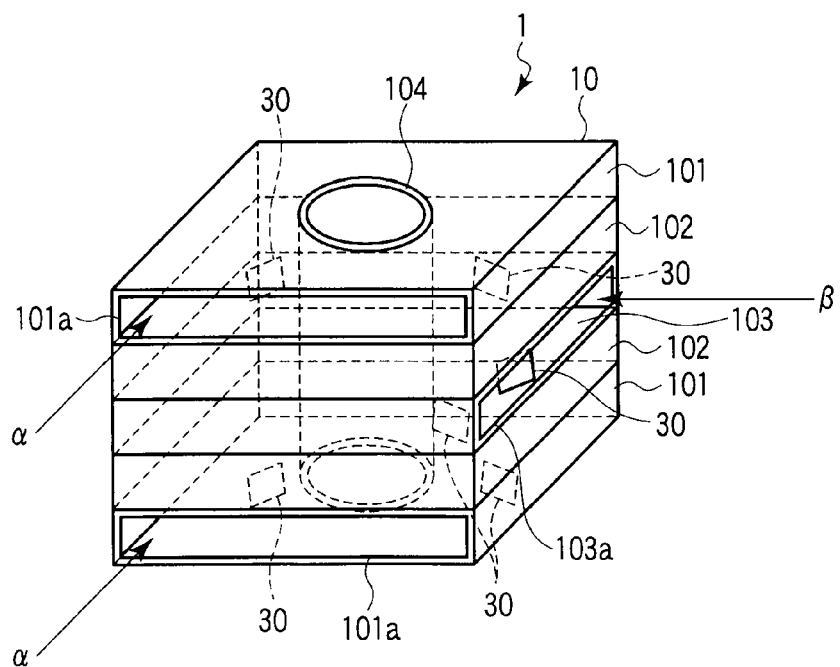
F I G. 12

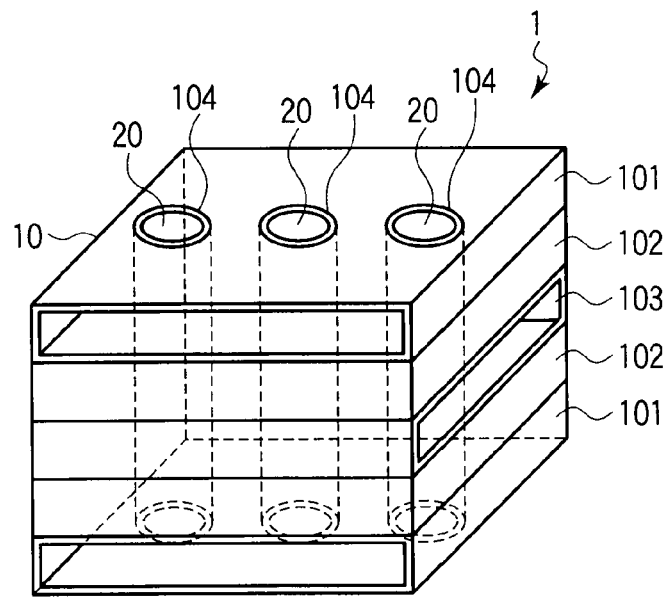
F I G. 13
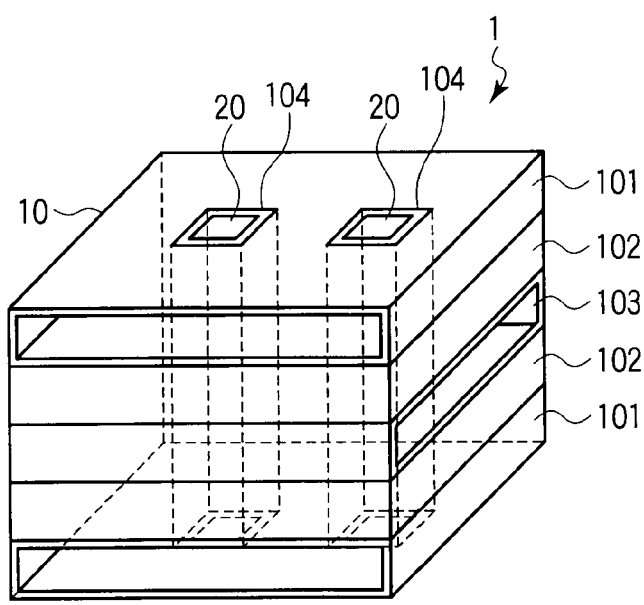
F I G. 14

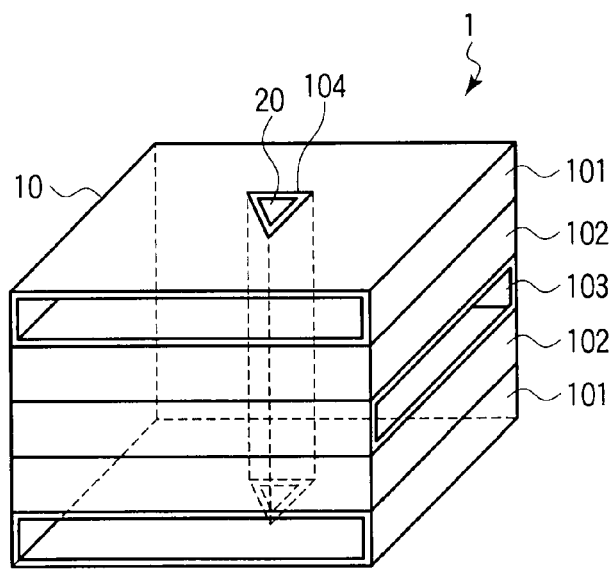
F I G. 15
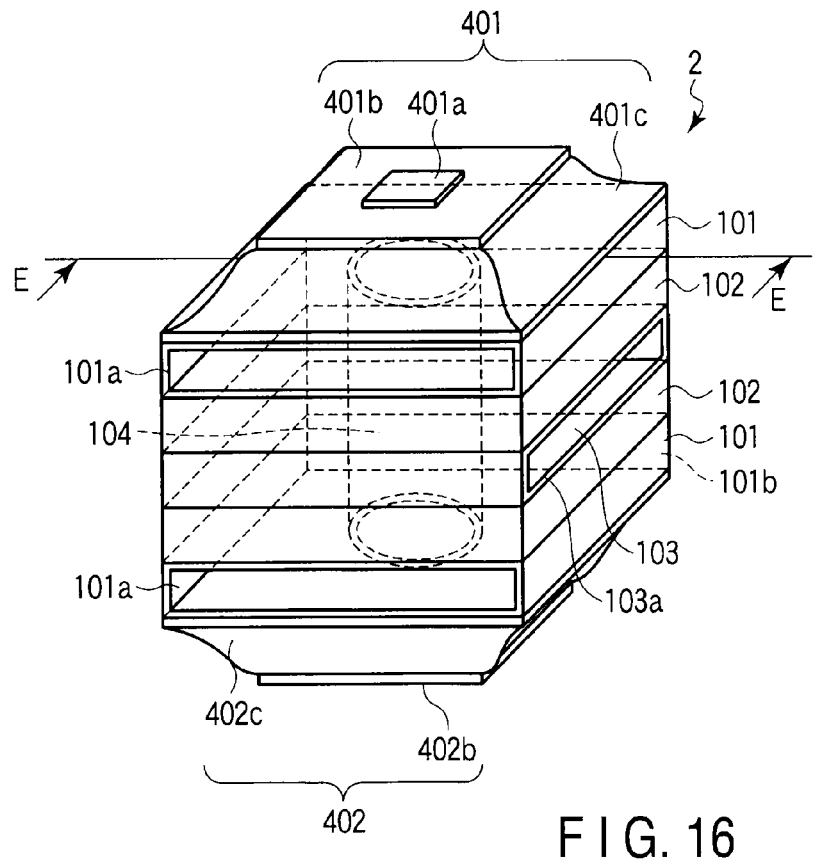
F I G. 16

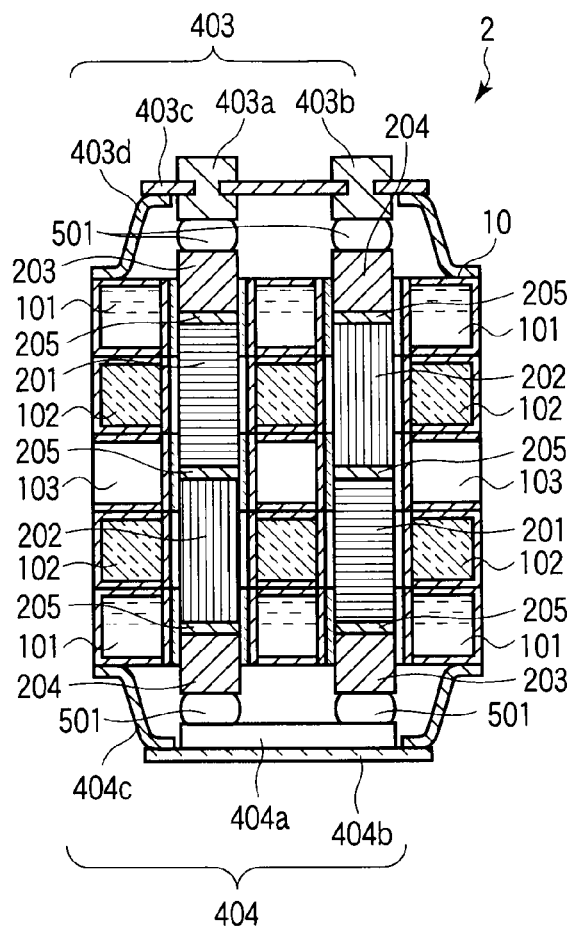
F I G. 19
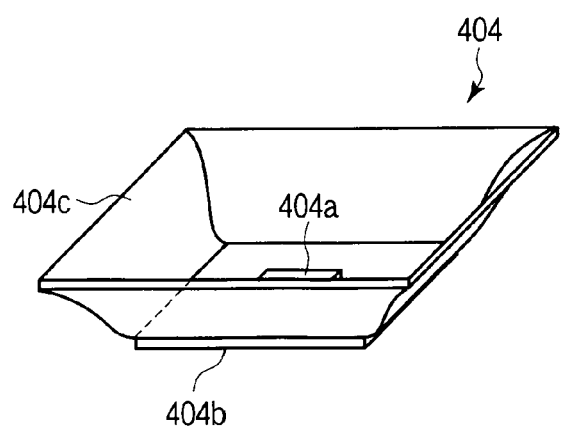
F I G. 20

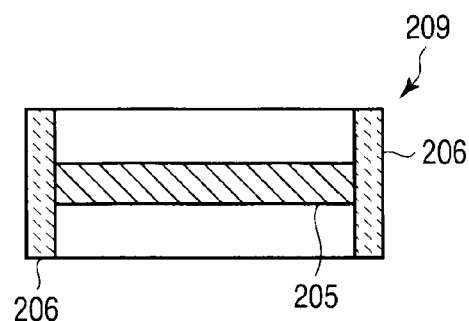
F I G. 23
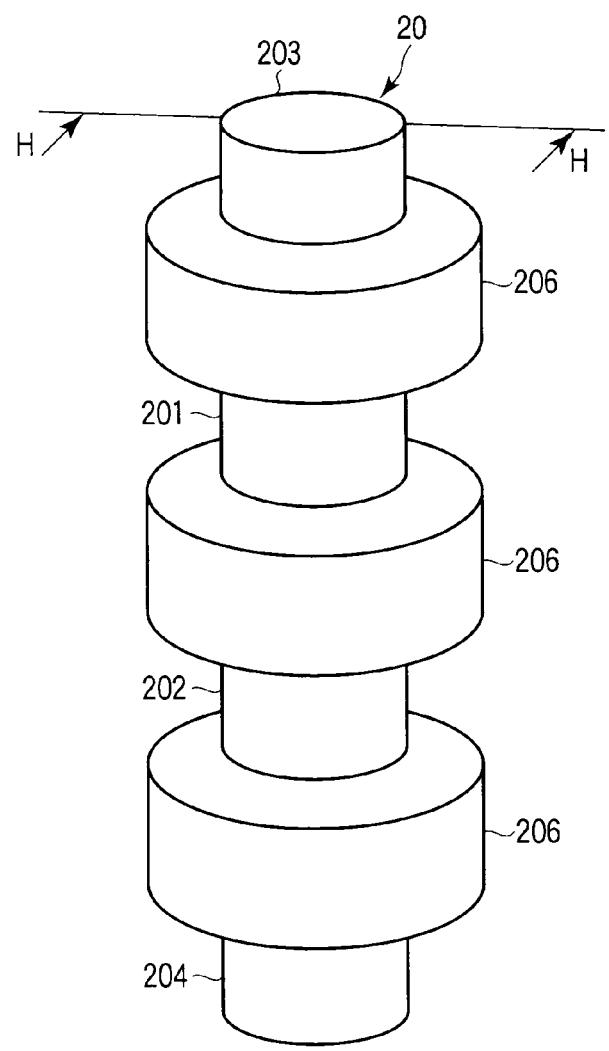
F I G. 24

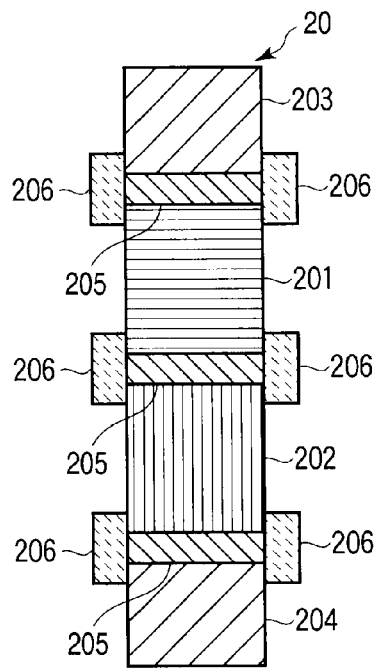
F I G. 25
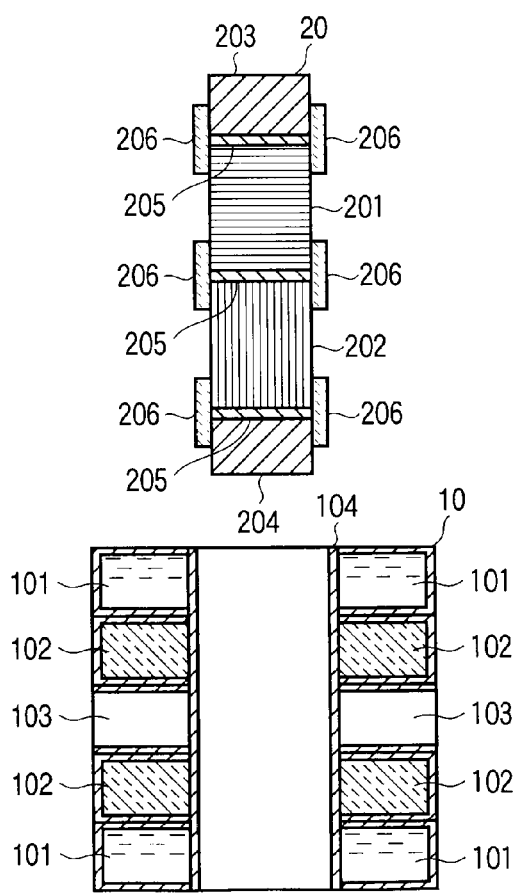
F I G. 26

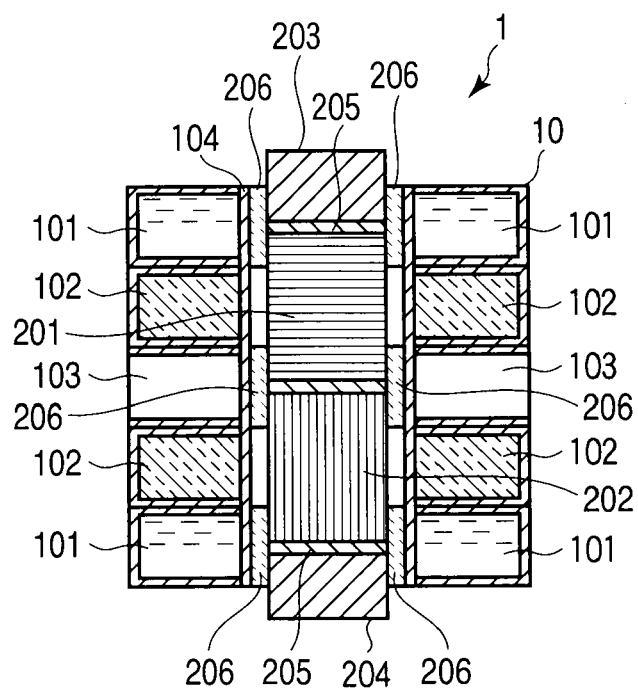
F I G. 27
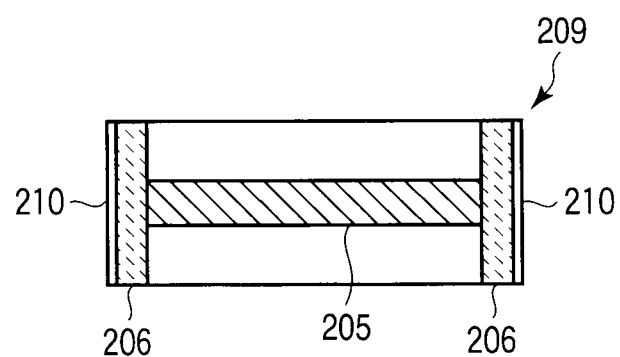
F I G. 28

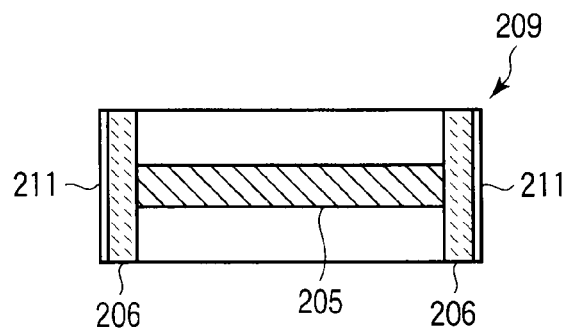
F I G. 29A
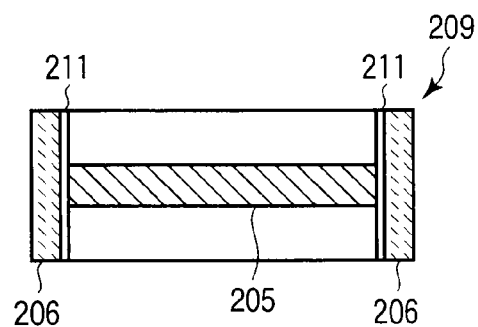
F I G. 29B
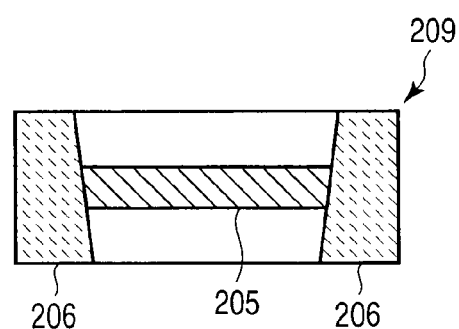
F I G. 30A

THERMOELECTRIC MODULE AND POWER GENERATION APPARATUS

CROSS-REFERENCE TO RELATED APPLICATIONS

This application is based upon and claims the benefit of priority from Japanese Patent Applications No. 2010-009492, filed Jan. 19, 2010; No. 2010-280313, filed Dec. 16, 2010; and No. 2011-005260, filed Jan. 13, 2011; the entire contents of all of which are incorporated herein by reference.

FIELD

Embodiments described herein relate generally to a thermoelectric module configured to directly convert thermal energy into electric energy and electric energy into thermal energy and a power generation apparatus.

BACKGROUND

In general, a thermoelectric device comprises two opposite electrodes and a thermoelectric material (for example, a pair of a first thermoelectric material and a second thermoelectric material) interposed between the electrodes. The thermoelectric device utilizes the thermoelectric effect of the thermoelectric material such as a Thomson effect, a Peltier effect, or Seebeck effect to directly convert thermal energy into electric energy or electric energy into thermal energy. Furthermore, thermoelectric modules comprising thermoelectric devices arranged together in parallel have been put to practical use.

An example of such a thermoelectric device or module is described in "Diller, R. W., Bell, L. E., "Experimental Results Confirming Improved Efficiency of Thermoelectric Power Generation System with Alternate Thermodynamic Cycles," Proceedings of the 22nd International Conference on Thermoelectrics Herault, France, August 2003. [searched on Jan. 19, 2010] Internet <URL:http://www.best.com/pdfs/Confirming-Results-TE-Power-Gen-Systems.pdf>. This document discloses a thermoelectric module comprising a high-temperature member, a thermoelectric material, a low-temperature member, a thermoelectric material, and a high-temperature member repeatedly and linearly arranged in this order.

However, in the thermoelectric module disclosed in the above-described Web page, the high-temperature member and the low-temperature member are each arranged between the thermoelectric materials. Thus, the thermoelectric module is used with the thermoelectric materials exposed to the atmosphere. Hence, the thermoelectric materials are, for example, oxidized or nitrided and thus degraded. The thermoelectric materials also degraded by water.

BRIEF DESCRIPTION OF THE DRAWINGS

FIG. 5 is a schematic diagram of a power generation member according to the first embodiment;

FIG. 6 is a cross-sectional diagram of a power generation module according to the first embodiment taken across line A-A in FIG. 1;

FIG. 11 is a cross-sectional diagram of a thermoelectric module according to a fourth embodiment taken along line A-A in FIG. 1;

FIG. 12 is a schematic diagram of the appearance of a thermoelectric module according to a fifth embodiment;

FIG. 13 is a schematic diagram of the appearance of a thermoelectric module according to a sixth embodiment;

FIG. 14 is a schematic diagram of the appearance of the thermoelectric module according to the sixth embodiment;

FIG. 15 is a schematic diagram of the appearance of the thermoelectric module according to the sixth embodiment;

FIG. 16 is a schematic diagram of the appearance of a power generation apparatus according to a seventh embodiment;

FIG. 19 is a cross-sectional diagram of the power generation apparatus according to the eighth embodiment taken alone line F-F in FIG. 18;

FIG. 20 is a schematic diagram of the appearance of a sealing member according to the eighth embodiment;

FIG. 23 is a cross-sectional diagram of the ring member according to the ninth embodiment taken along line G-G in FIG. 22;

FIG. 24 is a schematic diagram of the appearance of a power generation member according to the ninth embodiment;

FIG. 25 is a cross-sectional diagram of the power generation member according to the ninth embodiment taken along line H-H in FIG. 24;

FIG. 26 is a cross-sectional diagram of a thermoelectric module according to the ninth embodiment taken along line A-A in FIG. 1, wherein the power generation module has been separated from the thermoelectric module;

FIG. 27 is a cross-sectional diagram of the thermoelectric module according to the ninth embodiment taken along line A-A in FIG. 1;

FIG. 28 is a cross-sectional diagram of a ring member according to a tenth embodiment taken along line G-G in FIG. 22;

FIG. 29A is a cross-sectional diagram of a ring member according to an eleventh embodiment taken along line G-G in FIG. 22;

FIG. 29B is a cross-sectional diagram of a ring member according to another example of the eleventh embodiment taken along line G-G in FIG. 22;

FIG. 30A is a cross-sectional diagram of a ring member according to a twelfth embodiment taken along line G-G in FIG. 22;

DETAILED DESCRIPTION

In general, according to one embodiment, a thermoelectric module includes a housing and a power generation member. The housing has a first temperature layer and a second temperature layer, the first temperature layer and the second temperature layer being stacked, the housing further having a cylindrical through-hole provided so as to penetrate the first temperature layer and the second temperature layer. The power generation member has thermoelectric materials stacked such that current flows in one direction in the power generation member, the power generation member being provided in the through-hole so that opposite ends of each of the thermoelectric materials are positioned at the first temperature layer and the second temperature layer, respectively.

A detailed description will be given of the embodiment with reference to the accompanying drawings. The drawings are merely schematic illustrations of the thermoelectric module 1 of the embodiment. It should therefore be noted that the relations between the thicknesses and the planar dimensions, the thickness ratios of members, etc. are not necessarily shown as designed.

Figure 1:
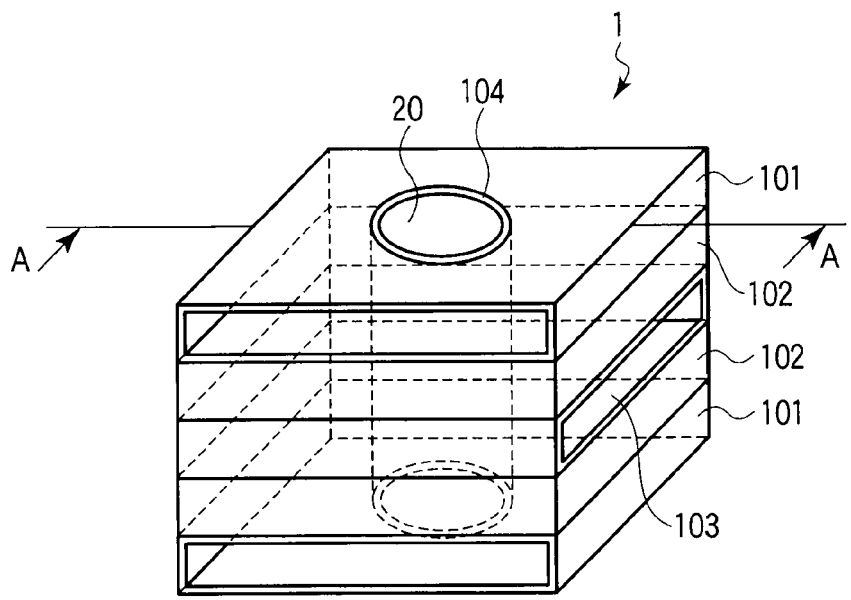
FIG. 1 is a schematic diagram of the appearance of an exemplary thermoelectric module according to a first embodiment.
Figure 2:
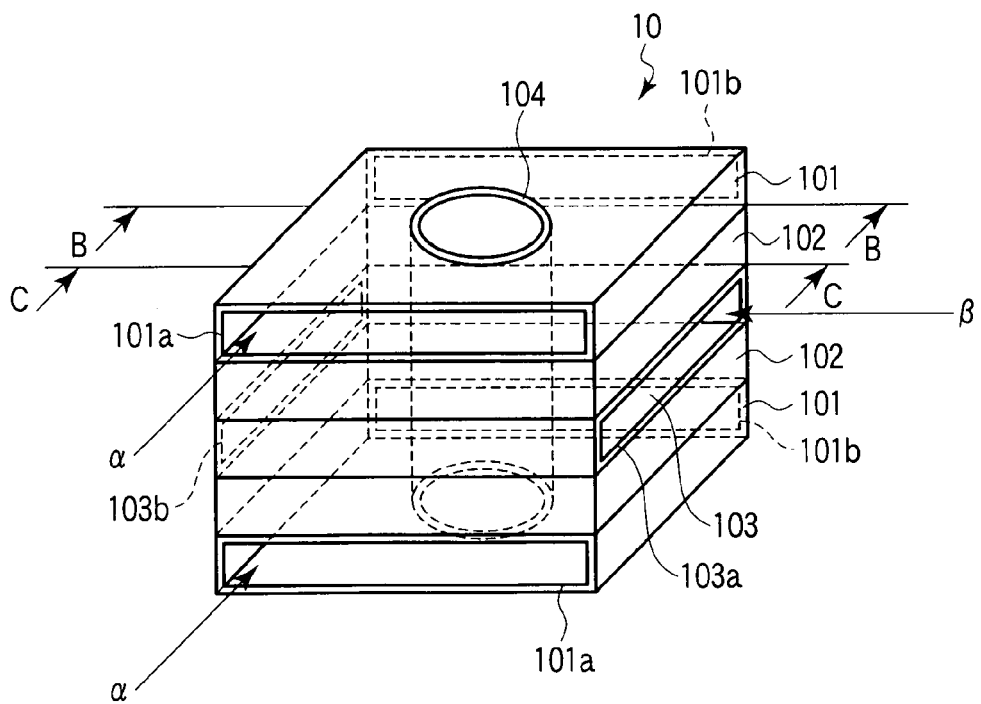
FIG. 2 is a schematic diagram of the appearance of a housing according to the first embodiment.
Figure 3:
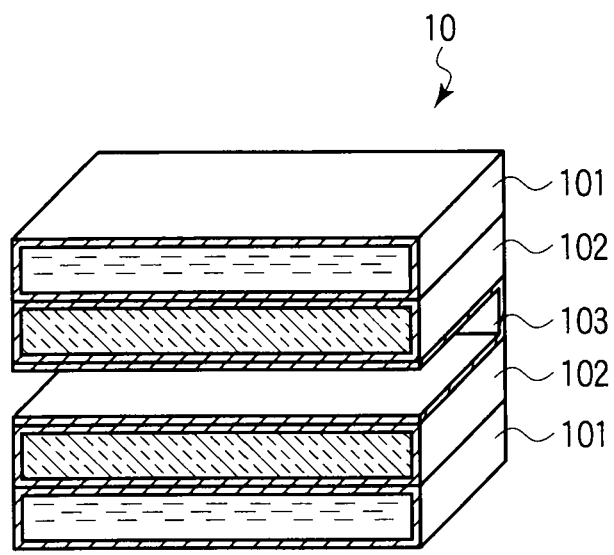
FIG. 3 is a schematic cross-sectional diagram of the appearance of the housing according to the first embodiment taken along line B-B in FIG. 2.
Figure 4:
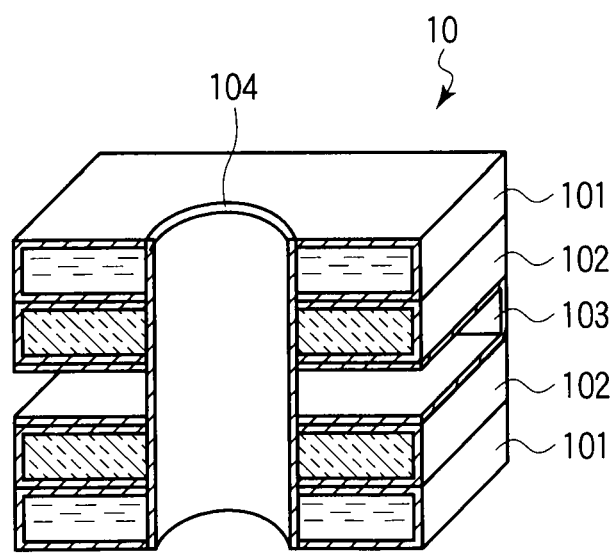
FIG. 4 is a schematic cross-sectional diagram of the appearance of the housing according to the first embodiment taken along line C-C in FIG. 2.

FIG. 1 is a perspective diagram schematically showing the configuration of a thermoelectric module 1 according to a first embodiment. The thermoelectric module 1 comprises a housing 10 and a power generation member 20. FIG. 2 is a perspective diagram schematically showing the configuration of the housing 10. FIG. 3 is a schematic cross-sectional diagram of the appearance of the housing 10 shown in FIG. 2; the diagram is taken along line B-B in FIG. 2. FIG. 4 is a schematic cross-sectional diagram of the appearance of the housing 10 shown in FIG. 2; the diagram is taken along line C-C in FIG. 2. The housing 10 comprises a low-temperature layer 101, a heat insulating layer 102, a high-temperature layer 103, and a cylindrical portion 104. The housing 10 has a five-layer structure including the low-temperature layer 101, heat insulating layer 102, high-temperature layer 103, heat insulating layer 102, and low-temperature layer 101 arranged in this order from the one end of the housing 10.

The housing 10 comprises any number of layers provided that the housing 10 has a layered structure with the order of the low-temperature layer 101, the heat insulating layer 102, the high-temperature layer 103, the heat insulating layer 102, and the low-temperature layer 101 repeated starting from the one end of the housing 10. Alternatively, the layered structure may be such that the order of the high-temperature layer 103, the heat insulating layer 102, the low-temperature layer 101, the heat insulating layer 102, and the high-temperature layer 103 is repeated starting from the one end of the housing 10.

The low-temperature layer (second temperature layer) 101 is wholly cooled by a low-temperature medium (for example, water). The low-temperature layer 101 is wholly cooled by sucked water into the layer 101 through an intake 101a provided closer to the reader in FIG. 2 as shown by arrow a, circulating the water throughout the layer 101, and discharging the water from an exhaust 101b. The present invention does not limit the direction in which and the position and angle at which the low-temperature medium flows into and out from the low-temperature layer 101 and the manner of flow inside the low-temperature layer 101. The low-temperature layer 101 is defined by a relative difference in temperature from the high-temperature layer 103 described below. Here, the low-temperature layer 101 is cooled by a water flow. However, another fluid such as liquid, gas or the like may be circulated through the low-temperature layer 101. Furthermore, the low-temperature layer 101 may be a medium cooled by external equipment.

The heat insulating layer 102 thermally insulates the low-temperature layer 101 from the high-temperature layer 103 by placing the internal space of the layer 102 in a reduced pressure atmosphere. The heat insulating layer 102 may be a medium has a heat insulating effect. Since the heat insulating layer 102 is located between the low-temperature layer 101 and the high-temperature layer 103, heat is prevented from escaping directly from the high-temperature layer 103 to the low-temperature layer 101.

The high-temperature layer (first temperature layer) 103 is wholly heated by a high-temperature medium (for example, gas). The high-temperature layer 103 is wholly heated by sucked gas into the layer 103 through an intake 103a provided in the right of FIG. 2 as shown by arrow β, circulating the gas throughout the layer 103, and discharging the gas from an exhaust 103b provided in the left of FIG. 2. The present embodiment does not limit the direction in which and the position and angle at which the high-temperature medium flows into and out from the high-temperature layer 103 and the manner of flow inside the high-temperature layer 103.

Here, the high-temperature layer 103 is heated by gas. However, another fluid such as gas, a liquid or the like may be circulated through the high-temperature layer 103. Furthermore, the high-temperature layer 103 may be a medium heated by external equipment.

The cylindrical portion (through-hole) 104 penetrates the layered structure comprising the low-temperature layer 101, the heat insulating layer 102, and the high-temperature layer 103, from the outer surface of a one-end-side layer to the outer surface of an other-end-side layer. The cylindrical portion 104 is shaped like a cylinder with a through-hole formed inside.

The housing 10 is made from, for example, metal such as Cu, Ni, Fe, or Al, an alloy based on such metal, or a ceramic material formed using silicon nitride, silicon carbide, aluminum nitride, or alumina as a material.

FIG. 5 is a perspective diagram schematically showing the configuration of the power generation member 20. The power generation member 20 comprises a first thermoelectric material 201 and a second thermoelectric material 202 between which the directions of current varies which flows when each material is allowed to generate power with one end of the material set to a high temperature and the other end of the material set to a low temperature, a first electrode 203, a second electrode 204, and a soaking plate 205.

The first thermoelectric material 201 is a p-type semiconductor comprising, for example, material(s) with thermoelectric effect(s). The second thermoelectric material 202 is an n-type semiconductor comprising, for example, a material with a thermoelectric effect. The first thermoelectric material 201 and the second thermoelectric material 202 each generate power when the temperature varies between the opposite ends of the material. In the first thermoelectric material 201, current flows from a high-temperature side to a low-temperature side. In contrast, in the second thermoelectric material 202, current flows from a low-temperature side to a high-temperature side. Thus, the first thermoelectric material 201 and the second thermoelectric material 201 are stacked such that current flows in the same direction both in the first thermoelectric material 201 and the second thermoelectric material 202 when the materials 201 and 202 are allowed to generate power.

The first electrode 203 and the second electrode 204 are provided at the respective opposite ends of the power generation member 20. The first electrode 203 and the second electrode 204 are used to allow the thermoelectric module 1 to transmit or receive electric energy to or from an external circuit.

The soaking plate 205 efficiently transmits heat to the first thermoelectric material 201 and the second thermoelectric material 202. The soaking plate 205 is provided between the first thermoelectric material 201 and the second thermoelectric material 202, which are arranged adjacent to each other when stacked. In the example shown in FIG. 5, the soaking plates 205 are provided between the first electrode 203 and the first thermoelectric material 201 and between the second electrode 204 and the second thermoelectric material 202. However, the soaking plate 205 need not necessarily be provided at these positions. The soaking plates 205 comprise material(s) which offer lower electric resistance(s) (higher conductivity(s)) than the first thermoelectric material 201 and the second thermoelectric material 202 and which has a high heat conductivity. The soaking plate 205 comprises, for example, one or more of materials such as Cu, Al, Fe, Mo, Ti, Ni, Co, Cr, Zr, Ta, and W.

The power generation member 20 is shaped like a cylinder with a diameter smaller than the inner diameter of the cylindrical portion 104. Thus, the power generation member 20 is housed in the cylindrical portion 104. The thermoelectric module 1 shown in FIG. 1 is thus formed.

FIG. 6 is a cross-sectional diagram of the thermoelectric module shown in FIG. 1; the diagram is taken along line A-A in FIG. 1. FIG. 6 shows that the power generation member 20 is housed in the cylindrical portion 104. The power generation member 20 has such a positional relationship with the housing 10 as described below.

The first thermoelectric material 201 and the second thermoelectric material 202 are arranged such that current flows in a constant direction from the second electrode 204 to the first electrode 203. The first thermoelectric material 201 is positioned such that one end of the first thermoelectric material 201 which is closer to the first electrode 203 is positioned at the area of the low-temperature layer 101, whereas the other end of the first thermoelectric material 201 which is closer to the second electrode 204 is positioned at the area of the high-temperature layer 202. Similarly, the second thermoelectric material 202 is positioned such that one end of the second thermoelectric material 202 which is closer to the first electrode 203 is positioned at the area of the high-temperature layer 202, whereas the other end of the second thermoelectric material 202 which is closer to the second electrode 204 is positioned at the area of the low-temperature layer 101.

The first electrode 203 and the second electrode 204 may be provided so as to seal the opposite ends of the cylindrical portion 104. In the first embodiment, current flows from the second electrode 204 to the first electrode 203.

In the first embodiment, a heat conducting material 206 is provided between the housing 10 and the power generation member 20. The heat conducting material 206 is provided between the power generation member 20 and each of the high-temperature layer 103 and the low-temperature layer 101. A space for heat insulation or a heat insulating member is arranged between the power generation member 20 and the heat insulating layer 102.

The heat conducting member 206 propagates heat from the low-temperature layer 101 or the high-temperature layer 103 to the first thermoelectric material 201 and the second thermoelectric material 202. Furthermore, the heat conducting member 206 electrically insulates the power generation member 20 from the cylindrical portion 104 of the cylinder 10. The heat conducting member 206 may comprise a material such as MgO, alumina, aluminum nitride, ceramics, or mica or a material such as electrically insulated metal whose heat conductivity is high. The heat conducting member 206 may be formed of a material that is not electrically insulated. In this case, the heat conducting member 206 needs to be insulated from the housing 10, the first thermoelectric material 201, the second thermoelectric material 202, and the soaking plate 205.

Here, the heat conducting member 206 is arranged at each of the opposite ends of the first thermoelectric material 201 or the second thermoelectric material 202. The heat conducting member 206 is not arranged between the area of the heat insulating layer 102 and each of the first thermoelectric material 201 and the second thermoelectric material 202. That is, a space is present between the first thermoelectric material 201 and the area of the heat insulating layer 102 and between the second thermoelectric material 202 and the area of the heat insulating layer 102. This is to make a difference in temperature between the opposite ends of the first thermoelectric material 201 or the second thermoelectric material 202, with the first thermoelectric material 201 or the second thermoelectric material 202 kept insulated from the housing 10. The space between the housing 10 and the power generation member 20 enables a reduction in the heat path between the low-temperature layer 101 and the high-temperature layer 103. This prevents power generation efficiency from decreasing with decreasing temperature difference, between the opposite ends of the first thermoelectric material 201 or the second thermoelectric material 202.

As described above, in the thermoelectric module 1, the space is provided between the housing 10 and the power generation member 20. However, a ring-like heat insulating member with a low heat conductivity may be arranged so as to fill the space.

In the thermoelectric module 1, a heat-electricity conversion efficiency is improved by arranging the heat insulating layer 102 between the high-temperature layer 101 and the low-temperature layer 103. However, the effects of the first embodiment may be exerted without provision of the heat insulating layer 102.

Furthermore, the first thermoelectric material 201 and the second thermoelectric material 202 need not necessarily have the same size. Additionally, if the power generation member 20 comprises a plurality of first thermoelectric materials 201 and a plurality of second thermoelectric materials 202, the first thermoelectric materials 201 need not necessarily have the same size or type and the second thermoelectric materials 202 need not necessarily have the same size or type. Moreover, the first thermoelectric material 201 may have a stack structure in which a plurality of first thermoelectric materials are stacked. This also applies to the second thermoelectric material 202.

If the housing 10 comprises a conductor, the thermoelectric module 1 requires the heat conducting member 206 described above in order to electrically insulate the housing 10 from the power generation member 20. On the other hand, if the housing 10 is formed of an insulator, the thermoelectric module 1 does not require the heat conducting member 206 described above.

Furthermore, the heat conducting member 206 may be provided on at least one of the outer peripheral surface of the power generation member 20 and the inner peripheral surface of the cylindrical portion 104. Then, the heat conducting member 206 may be positioned between the outer peripheral surface of the power generation member 20 and the inner peripheral surface of the cylindrical portion 104 when the heat conducting member 206, the power generation member 20, and the cylindrical portion 104 are assembled together.

Figure 7:
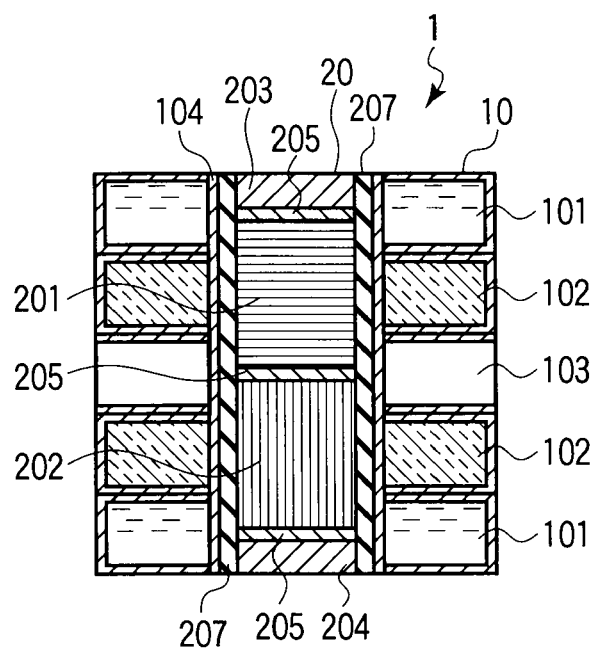
FIG. 7 is a cross-sectional diagram of a thermoelectric module according to a second embodiment taken across line A-A in FIG. 1.

Now, a second embodiment will be described. FIG. 7 is a cross-sectional diagram of the thermoelectric module 1 shown in FIG. 1; the diagram is taken along line A-A in FIG. 1. Components of the second embodiment which are similar to those of the first embodiment are denoted by the same reference numerals and will thus not be described. In the second embodiment, instead of the heat conducting member 206 described in the first embodiment, an insulating layer 207 is arranged between the housing 10 and the power generation member 20. The insulating layer 207 is cylindrical and is arranged so as to avoid the direct contact between the housing 10 and the power generation member 20. The inside of the cylindrical portion 104 is filled with the power generation member 20 and the insulating layer 207 and contains no space. The insulating layer 207 need not be formed of a single material.

Here, the insulating layer 207 corresponds to the heat path both of the thermoelectric materials (201 and 202) and both of the temperature layers (101 and 103). Thus, the insulating layer 207 desirably comprises a material with a low heat conductivity. In this case, when the insulating layer 207 is thin, the heat path is long in the vertical direction of the power generation member 20 and sufficiently short in the radial direction of the power generation member.

The insulating layer 207 may be provided on at least one of the outer peripheral surface of the power generation member 20 and the inner peripheral surface of the cylindrical portion 104. If the housing 10 is formed of an insulator, the insulating layer 207 is not required.

Figure 8:
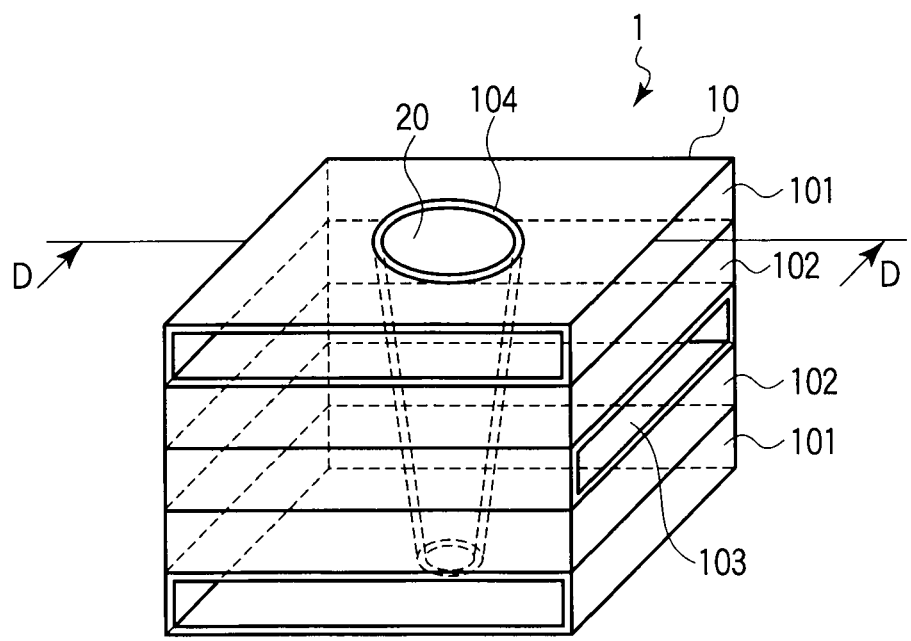
FIG. 8 is a schematic diagram of a thermoelectric module according to a third embodiment.
Figure 9:
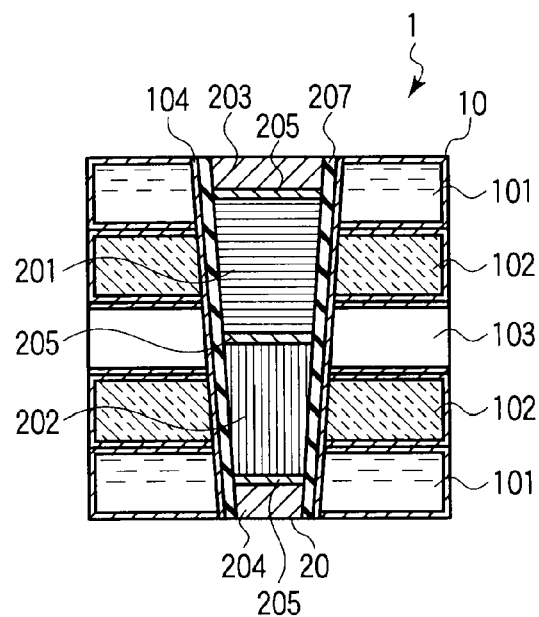
FIG. 9 is a schematic cross-sectional diagram of the appearance of a thermoelectric module according to the third embodiment taken across line D-D in FIG. 8.
Figure 10:
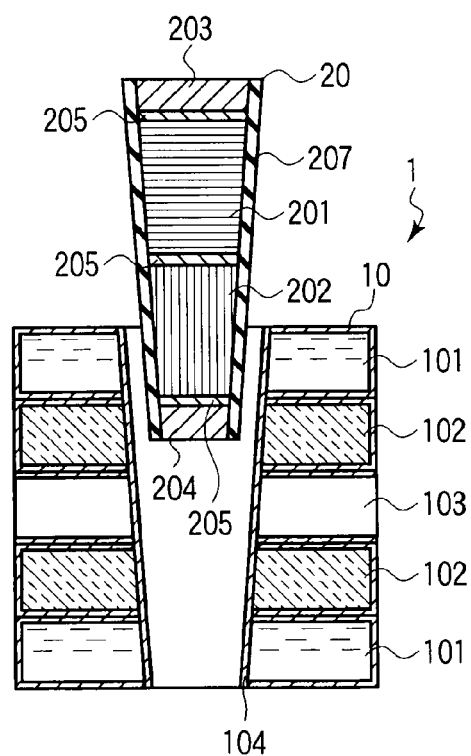
FIG. 10 is a diagram of the thermoelectric module according to the third embodiment from which a power generation member has been separated.

Now, a third embodiment will be described. FIG. 8 is a perspective view schematically showing the configuration of a thermoelectric module 1 according to the third embodiment. FIG. 9 is a cross-sectional diagram of the thermoelectric module 1 shown in FIG. 8; the diagram is taken along line D-D in FIG. 8. FIG. 10 is a diagram of the state shown in FIG. 9 and in which the power generation member 20 housed in the cylindrical portion 104 has been separated from the thermoelectric module 1. Components of the third embodiment which are similar to those of the second embodiment are denoted by the same reference numerals and will thus not be described. In the third embodiment, the cylindrical portion 104 provided in the housing 10 is tapered. The insulating layer 207 and the power generation member 20 housed in the insulating layer 207 is configured to have the same taper as that of the cylindrical portion 104.

Thus, according to the third embodiment, the power generation member 20 can be easily positioned in the housing 20 simply by pressing the power generation member 20, into the cylindrical portion 104.

The insulating layer 207 may be provided on at least one of the outer peripheral surface of the power generation member 20 and the inner peripheral surface of the cylindrical portion 104. If the housing 10 is formed of an insulator, then in the power generation module 1, the housing 10 and the power generation member 20 are electrically insulated from each other. Hence, the insulating layer 207 is not required.

Now, a fourth embodiment will be described. FIG. 11 is a cross-sectional diagram of the thermoelectric module 1 shown in FIG. 1; the diagram is taken along line A-A in FIG. 1. Components of the fourth embodiment which are similar to those of the second embodiment are denoted by the same reference numerals and will thus not be described. In the fourth embodiment, a heat conducting member 208 is provided in the power generation member 20. The heat conducting member 208 is positioned between the first thermoelectric material 201 and the second thermoelectric material 202 and where the area of the high-temperature layer 103. The ends of the first thermoelectric material 201 and the ends of the second thermoelectric material 202 are kept positioned at the area of the high-temperature layer 103. In the example shown in FIG. 11, the soaking plate 205 is provided between the first thermoelectric material 201 and the heat conducting member 208, and between the second thermoelectric material 202 and the heat conducting member 208. However, the soaking plate 205 need not necessarily be provided. Furthermore, a member corresponding to the heat conducting member 208 may be provided in the area of the low-temperature layer 101.

The heat conducting member 208 is formed of at least one material selected from a group of materials similar to those of the soaking plate 205. The heat conducting member 208 is provided in the power generation member 20, and the entire length of the power generation member 20 is unchanged. Hence, the volumes of the first thermoelectric material 201 and the second thermoelectric material 202 are smaller than those in the first embodiment. This serves to reduce the sizes of portions of the first thermoelectric material 201 and the second thermoelectric material 202 which are positioned at the area of the high-temperature layer 103. However, the conducting member 208 holds a difference in temperature. Thus, the materials of the first thermoelectric material 201 and the second thermoelectric material 202 can be saved without reducing the power generation efficiency.

In the illustrated example, the heat conducting member 208 is provided when the stack portion between the first thermoelectric material 201 and the second thermoelectric material 202 is positioned at the area of the high-temperature layer 103. The above description also applies to the case where the stack portion between the first thermoelectric material 201 and the second thermoelectric material 202 is positioned at the low-temperature layer 101.

Now, a fifth embodiment will be described. FIG. 12 is a perspective diagram schematically showing a thermoelectric module 1. Components of the fifth embodiment which are similar to those of the first embodiment are denoted by the same reference numerals and will thus not be described. In the fifth embodiment, current plates 30 are provided inside the low-temperature layer 101 and the high-temperature layer 103. The current plates 30 are arranged such that, for example, in the low-temperature layer 101, water or the like flows to the cylindrical portion 104. Similarly, the current plates 30 are arranged such that, for example in the high-temperature layer 103, gas or the like flows to the cylindrical portion 104.

The fifth embodiment allows heat to be efficiently propagated to the first thermoelectric material 201 and second thermoelectric material 202 in the power generation member 20 housed in the cylindrical portion 104. In the illustrated example, the current plates 30 are arranged inside both the low-temperature layer 101 and the high-temperature layer 103. Similar effects are exerted when the current plates 30 are arranged inside one of the low-temperature layer 101 and the high-temperature layer 103.

Now, a sixth embodiment will be described. Components of the sixth embodiment which are similar to those of the first embodiment are denoted by the same reference numerals and will thus not be described. FIG. 13 is a perspective diagram schematically showing a thermoelectric module 1. The thermoelectric module 1 comprises a plurality of cylindrical portions 104 in each of which the power generation member 20 is housed.

Furthermore, FIG. 14 is a perspective diagram schematically showing the thermoelectric module 1 according to another example of the sixth embodiment. The thermoelectric module 1 comprises cylindrical potions 104 each with a rectangular slot. Thus, the power generation members 20 are also shaped like quadrangular prisms. Furthermore, FIG. 15 is a perspective diagram schematically showing the thermoelectric module 1 according to another example of the sixth embodiment. The thermoelectric module 1 comprises a cylindrical potion 104 with a triangular slot. Thus, the power generation member 20 is also shaped like a triangular prism.

The sixth embodiment allows a plurality of power generation members 20 to be provided in the thermoelectric module 1. This correspondingly increases the amount of power generated. Furthermore, a cross section of the power generation member 20 which crosses the cylindrical portion 104 at right angles may have any shape.

An appropriate combination of any of the first embodiment to the sixth embodiment provides the thermoelectric module 1 with a high power generation efficiency.

Figure 17:
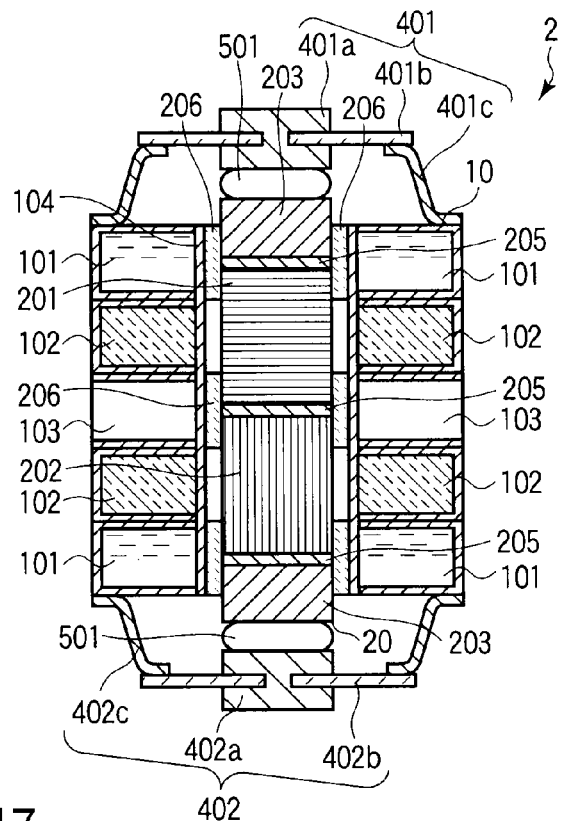
FIG. 17 is a cross-sectional diagram of the power generation apparatus according to the seventh embodiment taken alone line E-E in FIG. 16.

Now, a seventh embodiment will be described. Components of the seventh embodiment which are similar to those of the first embodiment are denoted by the same reference numerals and will thus not be described. The seventh embodiment relates to a power generation apparatus 2 using the thermoelectric module 1 described in the first embodiment illustrated in FIG. 1. FIG. 16 is a perspective diagram schematically showing the configuration of the power generation apparatus 2 according to the seventh embodiment. FIG. 17 is a cross-sectional diagram of the power generation apparatus 2 shown in FIG. 16; the diagram is taken along line E-E in FIG. 16.

The power generation apparatus 2 comprises the thermoelectric module 1, a sealing member 401, and a sealing member 402. The thermoelectric module 1 is configured similarly to that illustrated in the first embodiment and comprises one power generation member 1.

The sealing member 401 comprises a terminal 401a, an insulating member 401b, and a sealing frame 401c. The insulating member 401b is formed of an insulating material such as a ceramic material or the like. A through-hole is formed in the insulating member 401b. Electrode terminals provided on the respective opposite surfaces of the insulating member 401b are electrically connected together via the through-hole to form the terminal 401a. The terminal 401a and the insulating member 401b may be integrally formed as a single ceramic substrate. The sealing frame 401c is formed of, for example, metal such as Cu, Ni, Fe, or Al or an alloy based on any of the metals. The sealing member 401 is fixedly welded or brazed to the housing 10 via the sealing frame 401c to seal a first electrode 203-side of the through-hole 104 in an air-tight manner. The terminal 401a functions to obtain power generated by the power generation member 20. The terminal 401a is joined to the first electrode 203 with a junction material 501 such as solder or conductive paste.

Similarly, the sealing member 402 comprises a terminal 402a, an insulating member 402b, and a sealing frame 402c. The insulating member 402b is formed of an insulating material such as a ceramic material or the like. A through-hole is formed in the insulating member 402b. Electrode terminals provided on the respective opposite surfaces of the insulating member 402b are electrically connected together via the through-hole to form the terminal 402a. The terminal 402a and the insulating member 402b may be integrally formed as a single ceramic substrate. The sealing frame 402c is formed of, for example, metal such as Cu, Ni, Fe, or Al or an alloy based on any of the metals. The sealing member 402 is fixedly welded or brazed to the housing 10 via the sealing frame 402c to seal a second electrode 204-side of the through-hole 104 in an air-tight manner. The terminal 402a functions to obtain power generated by the power generation member 20. The terminal 402a is joined to the second electrode 204 with a junction material 502 such as solder or conductive paste.

The sealing member 401 is connected to a layer in the layered structure of the thermoelectric module 1 which is located at one end of the module 1 so as to cover the cylindrical potion 104. Similarly, the sealing member 402 is connected to a layer in the layered structure of the thermoelectric module 1 which is located at the other end of the module 1 so as to cover the cylindrical potion 104. Thus, the inside of the cylindrical portion 104 in which the power generation member 20 is housed is kept air-tight. The inside of the cylindrical portion 104 may be kept in a reduced pressure atmosphere or filled with inactive gas such as Ar.

According to the seventh embodiment, the inside of the cylindrical portion 104 in which the power generation member 20 is housed is sealed in the power generation apparatus 2. Hence, the power generation member 20 can be prevented from being degraded regardless of the environment in which the power generation apparatus 2 is used.

Now, an eighth embodiment will be described. Components of the eighth embodiment which are similar to those of the first embodiment are denoted by the same reference numerals and will thus not be described. The eighth embodiment relates to a power generation apparatus 2 using the thermoelectric module 1 comprising a plurality of such power generation members 20 as shown in FIG. 14. Moreover, in the eighth embodiment, the plurality of power generation members 20 provided in the thermoelectric module 1 are connected together in series.

Figure 18:
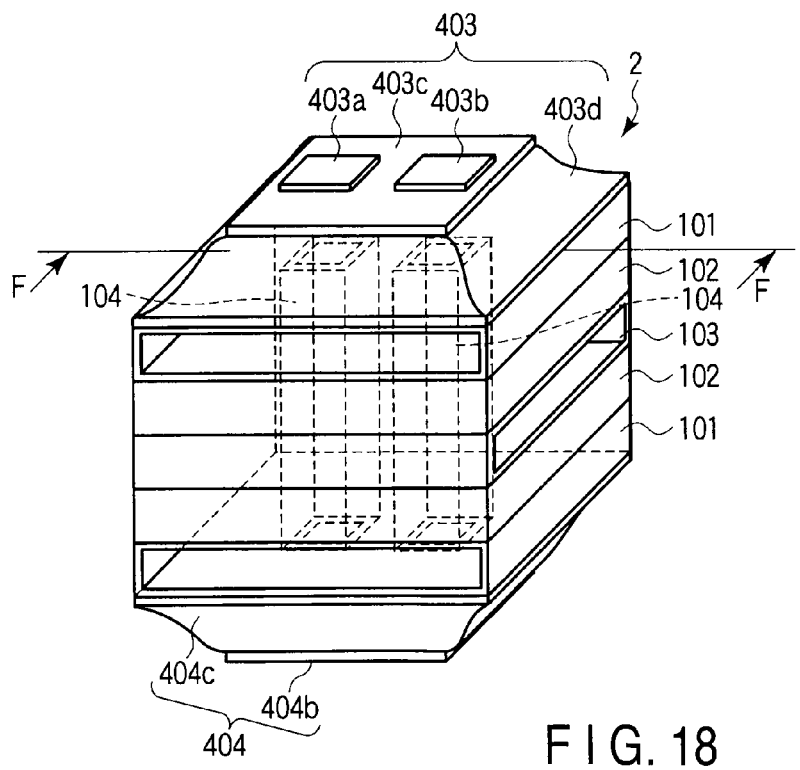
FIG. 18 is a schematic diagram of the appearance of a power generation apparatus according to an eighth embodiment.

FIG. 18 is a perspective diagram schematically showing the configuration of the power generation apparatus 2 according to the eighth embodiment. FIG. 19 is a cross-sectional diagram of the power generation apparatus 2 shown in FIG. 18; the diagram is taken along line F-F in FIG. 18. FIG. 20 is a perspective diagram schematically showing the configuration of the sealing member 404.

The power generation apparatus 2 comprises the thermoelectric module 1, a sealing member 403, and a sealing member 404. The thermoelectric module 1 comprises two cylindrical portions 104 and power generation members 20 housed in the respective cylindrical portions 104.

The two power generation members 20 are housed in the respective cylindrical portions 104 so that the direction of current flowing through the power generation member 20 varies between the two power generation members 20. That is, the thermoelectric module 1 comprises the power generation member 20 with the first electrode 203 positioned at a layer located at the one end of the thermoelectric module 1 and the power generation member 20 with the second electrode 204 positioned at the layer located at the one end of the thermoelectric module 1.

The sealing member 403 comprises a terminal 403a, a terminal 403b, an insulating member 403c, and a sealing frame 403d. The insulating member 403c is formed of an insulating material such as a ceramic material or the like. A plurality of (in the present embodiment, two) through-holes are formed in the insulating member 403c. Electrode terminals provided on the respective opposite surfaces of the insulating member 403c are electrically connected together via the through-holes to form the terminals 403a and 403b. The terminals 403a and 403b and the insulating member 403c may be integrally formed as a single ceramic substrate. The sealing frame 403d is formed of, for example, metal such as Cu, Ni, Fe, Al or an alloy based on any of the metals. The sealing member 403 is fixedly welded or brazed to the housing 10 via the sealing frame 403d to seal one side of each of the through-holes 104 in an air-tight manner. The terminals 403a and 403b function to obtain power generated by the power generation member 20. The terminal 403a is joined to the first electrode 203 with the junction material 501 such as solder or conductive paste. The terminal 403b is similarly joined to the second electrode 204.

The sealing member 404 comprises a wire 404a, an insulating member 404b, and a sealing frame 404c. For example, the insulating member 404b is formed of an insulating material such as a ceramic material or the like. The wire 404a is provided on one surface of the insulating member 404b to electrically connect the second electrode of one of the power generation members 20 to the first electrode 203 of the other power generation member 20. The wire 404a and the insulating member 404b may be integrally formed as a single ceramic substrate. The sealing frame 404c is formed of at least one material selected from a group of materials similar to those of the housing 10. The sealing member 404 is fixedly welded or brazed to the housing 10 via the sealing frame 404c to seal the other side of the through-hole 104 in an air-tight manner.

The sealing member 403 is connected to a layer in the layered structure of the thermoelectric module 1 which is located at the one end of the module 1 so as to cover the two cylindrical potions 104. Similarly, the sealing member 404 is connected to a layer in the layered structure of the thermoelectric module 1 which is located at the other end of the module 1 so as to cover the two cylindrical potions 104.

Thus, the inside of the cylindrical portions 104 in which the power generation members 20 are housed are sealed by the sealing members 403 and 404. The inside of the cylindrical portions 104 may be kept in a reduced pressure atmosphere or filled with inactive gas such as Ar. Furthermore, the sealing members 403 and 404 allow the plurality of power generation members 20 to be connected together in series. Hence, the power generation apparatus 2 can output power generated by the plurality of power generation members 20 connected together in series.

In the illustrated example, the two power generation members 20 provided in the power generation apparatus 2 are connected together in series. However, the above description also applies to the case where at least three power generation members 2 provided in the power generation apparatus 2 are connected together in series. That is, the above-described configuration may be modified by properly adjusting the direction of current flows in each power generation members 20 provided in the thermoelectric module 1, and terminals and wires provided in the sealing members 403 and 404.

Furthermore, if the thermoelectric module 1 comprises a plurality of the cylindrical portions 104 as shown in FIG. 13, a set of the sealing members 403 and 404 may be provided in each of the cylindrical portions 104. Alternatively, the plurality of cylindrical portions 104 may be covered with the set of the sealing members 403 and 404.

Figure 21:
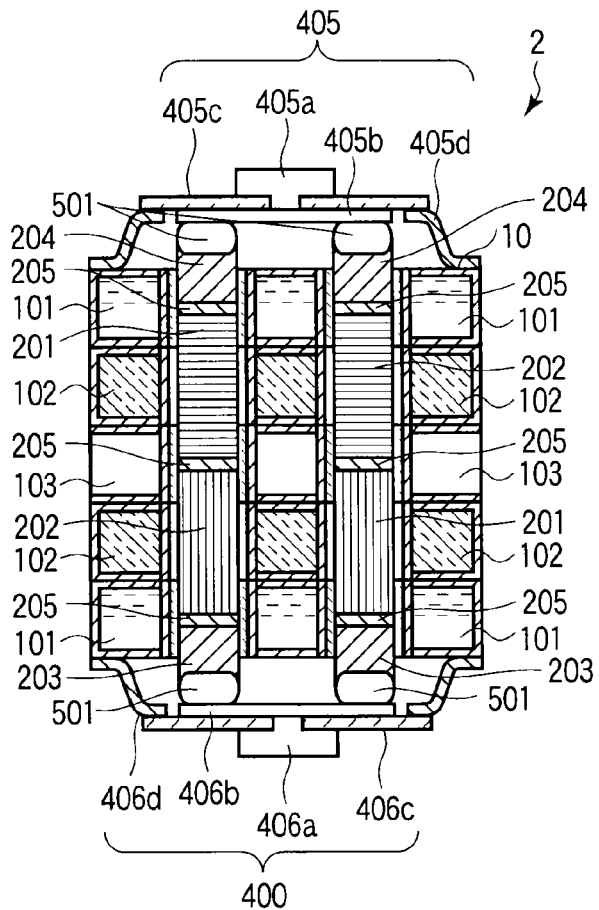
FIG. 21 is a cross-sectional diagram of a power generation apparatus according to the eighth embodiment.

In the case described below, at least two power generation members 20 provided in the power generation apparatus 2 are connected together in parallel. FIG. 21 shows an example of the power generation apparatus 2 shown in FIGS. 18 and 19. In this power generation apparatus 2, a sealing member 405 is provided instead of the sealing member 403, and a sealing member 406 is provided instead of the sealing member 404. Moreover, the plurality of power generation members 20 are provided in the thermoelectric module 1 so that current flows in the same direction in all the power generation members 20. That is, all the power generation members 20 are provided in the thermoelectric module 1 so that the first electrode 203 is located at a layer in the layered structure of the thermoelectric module 1 which is located at the one end of the module 1.

The sealing member 405 comprises a terminal 405a, wire 405b, an insulating member 405c, and a sealing frame 405d. For example, the insulating member 405c is formed of an insulating material such as a ceramic material or the like. A wire 405b is provided on one surface of the insulating member 405c so that the first electrodes 203 of the plurality of power generation members 20 can be electrically connected to the wire 405b. Furthermore, a terminal 405a is electrically connected to the other surface of the insulating material 405c via a through-hole formed in the insulating material 405c. The terminal 405a functions to obtain power generated by the power generation members 20. The terminal 405a, wire 405b and the insulating member 405c may be integrally formed as a single ceramic substrate. Additionally, the wire 405b is joined to the plurality of first electrodes 203 with the junction material 501 such as solder or conductive paste. The sealing frame 405d is formed of at least one material selected from a group of materials similar to those of the housing 10. The sealing member 405 is fixedly welded or brazed to the housing 10 via the sealing frame 405d to seal one side of the through-hole 104 in an air-tight manner.

Likewise, the sealing member 406 comprises a terminal 406a, a wire 406b, an insulating material 406c, and a sealing frame 406d. The terminal 406a functions to obtain power generated by the power generation member 20. The wire 406b is used to connect the second electrodes 204 of the plurality of power generation members 20. The wire 406b is joined to the plurality of second electrodes 204 with the junction material 501 such as solder or conductive paste. Thus, the power generation apparatus 2 can output power generated by the plurality of power generation members 20 connected together in parallel.

Now, a ninth embodiment will be described. The ninth embodiment relates to the precise positioning and fixation of the power generation member 20 and heat conducting member 206 with respect to the housing 10. As described above, the thermoelectric module 1 comprises a hollow structure in the cylindrical portion 104 in order to provide an appropriate heat path between the power generation member 20 and each of the low-temperature layer 101 and the high-temperature layer 103, while eliminating the heat path between the power generation member 20 and the heat insulating layer 102. The hollow structure is obtained by accurately positioning and fixing the power generation member 20 and the heat conducting member 206 with respect to the housing 10. However, it is not easy to position and fix the power generation member 20 and the heat conducting member 206 with respect to the housing 10.

Figure 22:
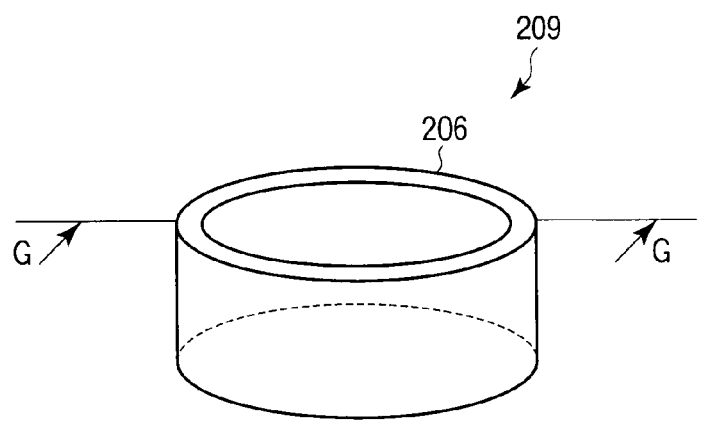
FIG. 22 is a schematic diagram of the appearance of a ring member according to a ninth embodiment.

FIG. 22 is a perspective view schematically showing the configuration of a ring member 209 according to the ninth embodiment. FIG. 23 is a schematic cross-sectional diagram of the appearance of the ring member 209; the diagram is taken along line G-G in FIG. 22. Components of the ninth embodiment which are similar to those of the above-described embodiments are denoted by the same reference numerals and will thus not be described. The ring member 209 corresponds to a combination of the heat conducting member 206 and the soaking plate (soaking member) 205. The heat conducting member 206 is shaped like a cylinder with almost the same inner diameter as that of the cylindrical portion 104 so as to fit in the cylindrical portion 104 of the housing 10. The shape of the heat conducting member 206 can be varied depending on the shape of the cylindrical portion 104 as described in the sixth embodiment. The heat conducting member 206 comprises a through-hole with an inner diameter that is uniform in a height direction. The heat conducting member 206 has almost the same size as that of the high-temperature layer 103 and the low-temperature layer 101 in the height direction. Here, the height direction is defined as the direction of the high-temperature layer 103 and the low-temperature layer 101 are stacked. The soaking plate 205 is positioned at an intermediate portion of the heat conducting member 206 in the height direction of the heat conducting member 206. The soaking plate 205 is a plate member with the same inner diameter as that of the through-hole in the heat conducting member 206. The soaking plate 205 is fixed with respect to the heat conducting member 206. Any method may be used to fix the soaking plate 205 to the heat conducting member 206; the method is not particularly limited.

FIG. 24 is a perspective diagram schematically showing the configuration of the power generation member 20 with the ring members 209, the first thermoelectric material 201, the second thermoelectric material 202, the first electrode 203, and the second electrode 204 coupled together according to the ninth embodiment. FIG. 25 is a schematic cross-sectional diagram of the appearance of the power generation member 20 with the ring members 209 coupled together; the diagram is taken along line H-H in FIG. 24. The first thermoelectric material 201, the second thermoelectric material 202, the first electrode 203, and the second electrode 204 are each shaped like a cylinder with the same size of outer diameter as inner diameter of the through-hole in the ring member 209. The first thermoelectric material 201, the second thermoelectric material 202, the first electrode 203, and the second electrode 204 are each pressed into the ring member 209 down to a position where the material or electrode comes into contact with the soaking plate 205. Because the first thermoelectric material 201, the second thermoelectric material 202, the first electrode 203, and the second electrode 204 are coupled together by the ring member 209, the power generation member 20 with the heat conducting members 206 coupled together can be easily assembled.

FIG. 26 is a cross-sectional view of the thermoelectric module 1 shown in FIG. 1; the diagram is taken along line A-A and shows that the power generation member 20 with the ring members 209 coupled together has not been pressed into the housing 10 yet. Compared to FIG. 26, FIG. 27 shows that the power generation member 20 with the ring members 209 coupled together has been pressed into the housing 10. The power generation member 20 with the heat conducting members 206 coupled together is pressed into the cylindrical portion 104 down to a position where each of the ring members 209 lies opposite the high-temperature layer 103 or the low-temperature layer 101. Thereafter, the power generation member 20 with the ring members 209 coupled together is positioned and fixed with respect to the hosing 10. Any method may be used to fix the housing 10 to the ring member 209; the method is not particularly limited.

Now, an example of a method for fixing the housing 10 to the ring members 209 will be described. As is the case with the third embodiment described with reference to FIG. 10, the cylindrical portion 104 is tapered in the height direction. The ring members 209 and the power generation member 20 are shaped to have the same taper as that of the cylindrical portion 104. Moreover, each of the ring members 209 is sized to fit in the cylindrical portion 104 at the desired position (specifically the position where the heat conducting member 206 lies opposite the high-temperature layer 103 or the low-temperature layer 101). Thus, the power generation member 20 with the ring members 209 coupled together can be easily positioned and fixed with respect to the housing 10 simply by pressing the power generation member 20 into the cylindrical portion 104.

Another example of a method for fixing the housing 10 to the ring members 209 will be described. The housing 10 is formed of a material with a smaller coefficient of thermal expansion than at least one of the heat conducting member 206 and the power generation member 20. When the power generation apparatus 2 is used, the heat conducting members 206 and the power generation member 20 are expanded. Thus, the heat conducting members 206 come into tight contact with the housing 10. Hence, the power generation member 20 and the heat conducting members 206 are fixed with respect to the housing 10. The housing 10 formed of a material with a small coefficient of thermal expansion is effective for reducing heat resistance. Consequently, the power generation apparatus 2 can increase power generation efficiency. The material having a small coefficient of thermal expansion and used for the housing 10 is, for example, an Invar alloy (Fe-36.5Ni, or the like), a super Invar alloy (Fe-32Mi-5Co), or a heat shrinkable material.

Now, a tenth embodiment will be described. The tenth embodiment relates to the configuration of the ring member 209. FIG. 28 is a schematic cross-sectional diagram of the appearance of the ring member 209 shown in FIG. 22; the diagram is taken along line G-G in FIG. 22. Components of the tenth embodiment which are similar to those of the above-described embodiments are denoted by the same reference numerals and will thus not be described. If the heat conducting member 206 is formed of an insulating material such as ceramics, the outer peripheral surface of the heat conducting member 206 is covered with a thin film 210. The thin film 210 is a conductor material such as Cu which has a high heat conductivity. The heat resistance between the heat conducting member 206 and the housing 10 may be lower than that obtained when the heat conducting member 206 is not covered with the thin film 210. Thus, the power generation apparatus 2 offers improved power generation efficiency.

Now, an eleventh embodiment will be described. The eleventh embodiment relates to the configuration of the ring member 209. FIG. 29A and FIG. 29B are schematic cross-sectional diagrams of the appearance of the ring member 209 shown in FIG. 22; the diagram is taken along line G-G in FIG. 22. Components of the eleventh embodiment which are similar to those of the above-described embodiments are denoted by the same reference numerals and will thus not be described. If the heat conducting member 206 is formed of a conductor such as metal, the outer peripheral surface of the heat conducting member 206 is covered with a thin film 211 as shown in FIG. 29A. The thin film 211 is an insulating material. Similarly, if the heat conducting member 206 is formed of a conductor such as metal, the inner peripheral surface of the through-hole in the heat conducting member 206 is covered with the thin film 211 as shown in FIG. 29B. The heat resistance between the heat conducting member 206 and the housing 10 may be lower than that obtained when the heat conducting member 206 is not covered with the thin film 211. Thus, the power generation apparatus 2 offers improved power generation efficiency.

Figure 30B:
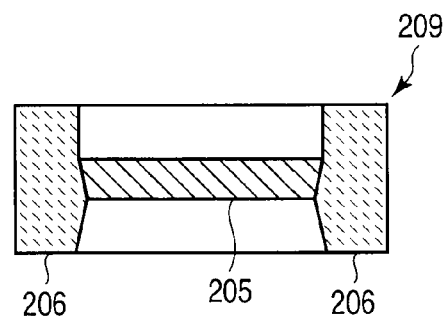
FIG. 30B is a cross-sectional diagram of a ring member according to another example of the twelfth embodiment taken along line G-G in FIG. 22.
Figure 30C:
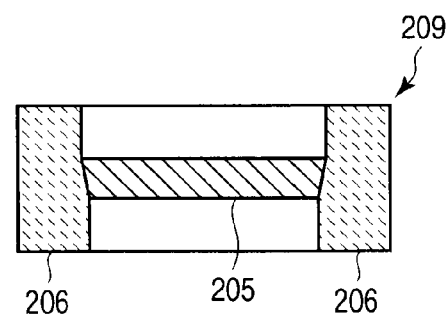
FIG. 30C is a cross-sectional diagram of a ring member according to another example of the twelfth embodiment taken along line G-G in FIG. 22.

Now, a twelfth embodiment will be described. The twelfth embodiment relates to the configuration of the ring member 209. FIGS. 30A, 30B, and 30C are schematic cross-sectional diagrams of the appearance of the ring member 209 shown in FIG. 22; the diagrams are taken along line G-G in FIG. 22. Components of the twelfth embodiment which are similar to those of the above-described embodiments are denoted by the same reference numerals and will thus not be described. The heat conducting member 206 comprises a through-hole tapered from a first surface (the upper side of FIG. 30A) toward a second surface (the lower side of FIG. 30A). The soaking plate 205 is also shaped to have the same taper as that of the through-hole in the heat conducting member 206. The soaking plate 205 is sized to fit in the heat conducting member 206 at the desired position (specifically an intermediate portion of the heat conducting member 206 in the height direction).

The shape of the through-hole in the heat conducting member 206 is separated into the following three portions in the description of the example illustrated in FIG. 30B: the intermediate portion at which the soaking plate 205 is fitted, a first portion at which one of the first thermoelectric material 201, the second thermoelectric material 202, the first electrode 203, and the second electrode 204 is fitted through a hole in the first surface (the upper side of FIG. 30B), and a second portion at which one of the first thermoelectric material 201, the second thermoelectric material 202, the first electrode 203, and the second electrode 204 is fitted through a hole in the second surface (the lower side of FIG. 30B). The intermediate portion of the through-hole in the heat conducting member 206 is tapered from the first surface toward the second surface by an amount corresponding to the thickness of the soaking plate 205. The first portion of the through-hole in the heat conducting member 206 is shaped to have the same inner diameter between the first surface and the intermediate portion. The first portion and intermediate portion of the through-hole in the heat conducting member 206 have the same shape at the position where the first portion and the intermediate portion are connected together. The second portion of the through-hole in the heat conducting member 206 is tapered from the second surface toward the intermediate portion. The second portion and intermediate portion of the through-hole in the heat conducting member 206 have the same shape at the position where the second portion and the intermediate portion are connected together. Furthermore, the opening of the through-hole in the second surface of the heat conducting member 206 may have the same size as that of the opening of the through-hole in the first surface of the heat conducting member 206. The soaking plate 205 is shaped to have the same taper as that of the intermediate portion of the through-hole in the heat conducting member 206. Moreover, the soaking plate 205 is sized to fit in the heat conducting member 206 at the intermediate portion of the through-hole in the heat conducting member 206. The soaking plate 205 may have a thickness equal to, or more than the height dimension of the intermediate portion in the through-hole of the heat conducting member 206.

The shape of the through-hole in the heat conducting member 206 is separated into an intermediate portion, a first portion, and a second portion in the description of the example illustrated in FIG. 30C as described with reference to FIG. 30B. The intermediate portion of the through-hole in the heat conducting member 206 is tapered from the first surface toward the second surface by an amount corresponding to the thickness of the soaking plate 205 in the height direction. The first portion of the through-hole in the heat conducting member 206 is shaped to have the same inner diameter between the first surface and the intermediate portion. The first portion and intermediate portion of the through-hole in the heat conducting member 206 have the same shape at the position where the first portion and the intermediate portion are connected together. The second portion of the through-hole in the heat conducting member 206 is shaped to have the same inner diameter between the intermediate portion and the second surface. The second portion and intermediate portion of the through-hole in the heat conducting member 206 have the same shape at the position where the second portion and the intermediate portion are connected together. Thus, the opening of the through-hole in the second surface of the heat conducting member 206 has a smaller size than the opening of the through-hole in the first surface of the heat conducting member 206. The soaking plate 205 is shaped to have the same taper as that of the intermediate portion of the through-hole in the heat conducting member 206. Moreover, the soaking plate 205 is sized to fit in the heat conducting member 206 at the intermediate portion of the through-hole in the heat conducting member 206. The soaking plate 205 may have a thickness equal to, or more than the height dimension of the intermediate portion in the through-hole of the heat conducting member 206.

In the twelfth embodiment, as described with reference to FIGS. 30A, 30B, and 30C, the through-hole in the heat conducting member 206 may be tapered at least at the portion at which the soaking plate is fitted. Thus, the twelfth embodiment allows the soaking plate 205 to be easily fixed with respect to the heat conducting member 206.

Figure 31:
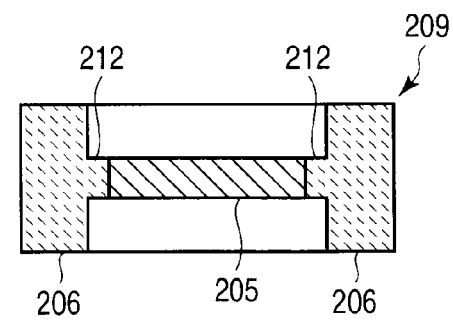
FIG. 31 is a cross-sectional diagram of a ring member according to a thirteenth embodiment taken along line G-G in FIG. 22.

Now, a thirteenth embodiment will be described. The thirteenth embodiment relates to the configuration of the ring member 209. FIG. 31 is a schematic cross-sectional diagram of the appearance of the ring member 209 shown in FIG. 22; the diagram is taken along line G-G in FIG. 22. Components of the thirteenth embodiment which are similar to those of the above-described embodiments are denoted by the same reference numerals and will thus not be described. In the description of the thirteenth embodiment, the shape of the through-hole in the heat conducting member 206 is separated into an intermediate portion, a first portion, and a second portion as described with reference to FIG. 30B. The heat conducting member 206 internally comprises a through-hole with an inner diameter that is uniform in the height direction except for the intermediate portion at which the soaking plate 205 is fitted. The height direction size of the intermediate portion of the through-hole in the heat conducting member 206 is the same as the thickness of the soaking plate 205. In addition, the soaking plate 205 may have a thickness more than the height dimension of the intermediate portion in the through-hole of the heat conducting member 206. The heat conducting member 206 comprises a projection portion 212 provided at the intermediate portion of the through-hole (at the position where the heat conducting member 206 contacts the soaking member 205) and projecting from the inner peripheral surface of the heat conducting member 206. The projection portion 212 may be continuous or discontinuous in the circumferential direction of the inner peripheral surface of the heat conducting member 206. That is, the intermediate portion of the through-hole in the heat conducting member 206 has a smaller inner diameter than those of the first and second portions.

Owing to the projection portion 212, the heat conducting portion 206 comprises a step at the connection between the first portion and the intermediate portion. Similarly, owing to the projection portion 212, the heat conducting portion 206 comprises a step at the connection between the second portion and the intermediate portion. The soaking plate 205 is fixed at the intermediate portion of the through-hole. The first thermoelectric material 201, the second thermoelectric material 202, the first electrode 203, and the second electrode 204 are each caught at the step in the through-hole in the heat conducting member 206 when the power generation member 20 is assembled. In other words, once inserted into the heat conducting member 206 down to the appropriate position, the first thermoelectric material 201, the second thermoelectric material 202, the first electrode 203, and the second electrode 204 are each hindered from being further driven. Thus, the first thermoelectric material 201, the second thermoelectric material 202, the first electrode 203, and the second electrode 204 can be easily positioned with respect to the heat conducting member 206.

Figure 32:
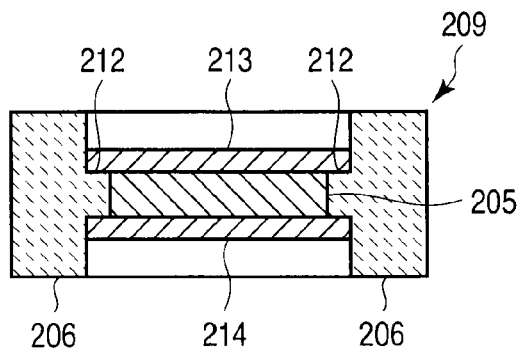
FIG. 32 is a cross-sectional diagram of a ring member according to a fourteenth embodiment taken along line G-G in FIG. 22.

Now, a fourteenth embodiment will be described. The fourteenth embodiment relates to the configuration of the ring member 209. FIG. 32 is a schematic cross-sectional diagram of the appearance of the ring member 209 shown in FIG. 22; the diagram is taken along line G-G in FIG. 22. Components of the fourteenth embodiment which are similar to those of the above-described embodiments are denoted by the same reference numerals and will thus not be described. The configuration of the heat conducting member 206 and soaking plate 205 in the fourteenth embodiment is similar to that in the thirteenth embodiment described with reference to FIG. 31.

In the fourteenth embodiment, the ring member 209 further comprises soaking plates 213 and 214. The soaking plates 213 and 214 are shaped to have the same inner diameter as that of the first portion (or second portion) of the through-hole in the heat conducting member 206. The soaking plates 213 and 214 are formed of a material similar to that of the soaking plate 205. The soaking plates 213 and 214 sandwichingly hold the soaking plate 205 from the opposite sides in the height direction. The soaking plate 213 contacts the projection portion 212 (the step at the connection between the first portion and the intermediate portion) and the soaking plate 205. The soaking plate 214 contacts the projection portion 212 (the step at the connection between the second portion and the intermediate portion) and the soaking plate 205. The soaking plates 205, 213, and 214 can be positioned and fixed with respect to the heat conducting member 206 by welding or the like. A method of fixing the soaking plates 205, 213, and 214 is not limited, but welding such as diffusion welding or resistance welding may be used. The fixing may be carried out on all or part of at least a portion of the heat conducting member 206 contacting each of the soaking plates 213 and 214. The fourteenth embodiment allows the soaking plate 205 to be easily fixed with respect to the heat conducting member 206. In addition, the soaking plate 205 may have a thickness more than the height dimension of the intermediate portion in the through-hole of the heat conducting member 206.

Figure 33:
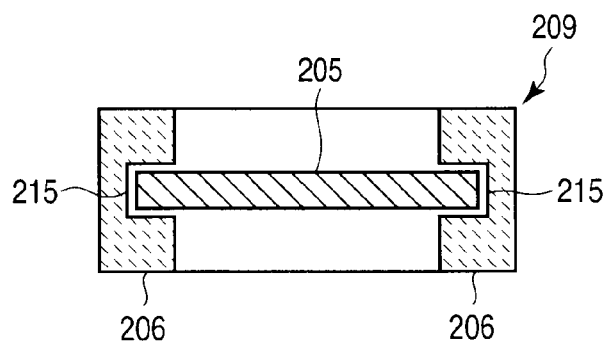
FIG. 33 is a cross-sectional diagram of a ring member according to a fifteenth embodiment taken along line G-G in FIG. 22.

Now, a fifteenth embodiment will be described. The fifteenth embodiment relates to the configuration of the ring member 209. FIG. 33 is a schematic cross-sectional diagram of the appearance of the ring member 209 shown in FIG. 22; the diagram is taken along line G-G in FIG. 22. Components of the fifteenth embodiment which are similar to those of the above-described embodiments are denoted by the same reference numerals and will thus not be described. In the description of the fifteenth embodiment, the shape of the through-hole in the heat conducting member 206 is separated into an intermediate portion, a first portion, and a second portion as described with reference to FIG. 30B. The heat conducting member 206 internally comprises a through-hole with an inner diameter that is uniform in the height direction except for the intermediate portion at which the soaking plate 205 is fitted. The height direction size of the intermediate portion of the through-hole in the heat conducting member 206 is equal to or thicker than the thickness of the soaking plate 205. The heat conducting member 206 comprises a groove portion 215 formed at the intermediate portion of the through-hole and recessed outward from the inner peripheral surface of the heat conducting member 206. The groove portion 215 is continuous in the circumferential direction of the inner peripheral surface of the heat conducting member 206. That is, the intermediate portion of the through-hole in the heat conducting member 206 has an inner diameter equal to or larger than those of the first portion and second portion. The soaking plate 205 is shaped to have an inner diameter larger than that of the first portion (or second portion) of the through-hole in the heat conducting member 206 and smaller than that of the intermediate portion. When the power generation member 20 is assembled, the soaking plate 205 is pressed into the groove portion 215. Thus, the soaking plate 205 can be easily fixed with respect to the heat conducting member 206.

Figure 34:
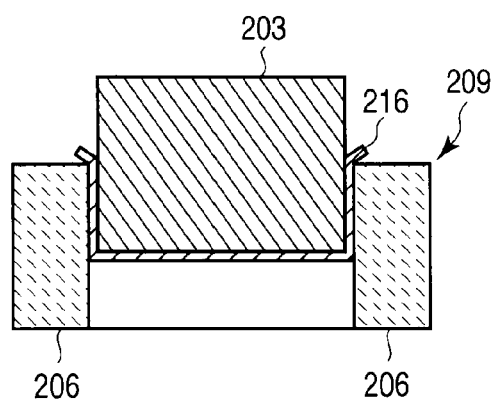
FIG. 34 is a cross-sectional diagram of a ring member according to a sixteenth embodiment taken along line G-G in FIG. 22.

Now, a sixteenth embodiment will be described. The sixteenth embodiment relates to the configuration of the ring member 209. FIG. 34 is a schematic cross-sectional diagram of the appearance of the ring member 209 shown in FIG. 22; the diagram is taken along line G-G in FIG. 22. FIG. 34 shows that the first electrode 203 has been pressed into the ring member 209 by way of example. Components of the sixteenth embodiment which are similar to those of the above-described embodiments are denoted by the same reference numerals and will thus not be described. In the sixteenth embodiment, the ring member 209 refers to a combination of the heat conducting member 206 and the soaking plate 216. The soaking plate 216 is formed of a material similar to that of the soaking plate 205. The soaking plate 216 is an elastic metal foil. The soaking plate 216 is larger than the opening of the through-hole in the heat conducting member 206. When the power generation member 20 is assembled, the side of the first electrode 203 which is pressed into the heat conducting member 206 is covered with the soaking plate 216 and pressed into the heat conducting member 206 together with the soaking plate 216. When pressed into the heat conducting member 206, the first electrode 203 is driven down to the desired position in the through hole in the heat conducting member 206. Moreover, the soaking plate 216 is sandwiched between the first electrode 203 and the inner peripheral surface of the heat conducting member 206. Thus, the soaking plate 216 can be easily fixed with respect to the heat conducting member 206.

If the soaking plate 216 is pressed into the heat conducting member 206 by the first electrode 203 from the first surface side of the heat conducting member 206 in the height direction, another soaking plate need not be pressed in together with the first thermoelectric material 201 from the second surface side of the heat conducting member 206 in the height direction. Furthermore, the soaking plate 216 may be sized so as to stick out from the heat conducting member 206 when the first electrode 203 is completely pressed into the heat conducting member 206. That is, the soaking plate 216 may be sized to cover the first electrode 203 so as to prevent the first electrode 203 from directly contacting the first thermoelectric material 201 and to be partly sandwiched between the first electrode 203 and the inner peripheral surface of the heat conducting member 206. This also applies to the case where any of the first thermoelectric material 201, the second thermoelectric material 202, and the second electrode 204 is pressed into the heat conducting member 206 together with the soaking plate 216.

In the above-described embodiments, the ring member 209 with the soaking plate 205 fixed with respect to the heat conducting member 206 is used to facilitate the assembly of the power generation member 20. Thus, the power generation member 20 and the heat conducting member 206 can be easily positioned and fixed with respect to the housing 10. Therefore, according to the above-described embodiments, the thermoelectric module 1 and the power generation apparatus 2 using the thermoelectric module 1 can easily control the heat path in the power generation member 20. As a result, the thermoelectric module 1 and the power generation apparatus 2 using the thermoelectric module 1 can efficiently generate power.

In the above-described embodiments, the housing 10 is separated from the heat conducting member 206. However, the housing 10 and the heat conducting member 206 may be integrated together when formed of the same material. In this case, the soaking plate 205 may be fixed to the heat conducting member 206 in any of the configurations in the above-described embodiments. This increases the accuracy at which the power generation member 20 is positioned in the housing 10.

Now, a seventeenth embodiment will be described. As shown in FIG. 1, both the outermost layers of the housing 10 are formed of the low-temperature layer 101. The following effects are exerted when the outermost layers of the housing 10 are formed of the low-temperature layer 101. For example, if a gas having a temperature of 600 degrees or so circulates through the high-temperature layer 103 and cooling water circulates through the low-temperature layer 101, the temperature in the vicinity of the outer periphery of the housing 10 is as low as about 150 degrees, when the power generation apparatus 2 is in use. This is nothing but an example, and what is required is that the power generation apparatus 2 is used in an environment that causes a temperature difference between the low-temperature layer 101 and the high-temperature layer 103. Therefore, there can be a case where a gas having a temperature of 150 degrees or so circulates through the high-temperature layer 103 and a liquid having a temperature of 60 degrees or so circulates through the low-temperature layer 101. As can be seen from this, the case where the temperature in the vicinity of the outer periphery of the housing 10 is about 150 degrees, is in no way restricting. A reduction can be made in the adverse effect of degradation that may be caused by metal diffusion or oxidation between the first thermoelectric material 201 and the first electrode 203 and between the second thermoelectric material 202 and the second electrode 204. This increases the degree of freedom at which materials are selected for the first electrode 203 and the second electrode 204. Even when the sealing members 401 and 402 are provided on the respective outermost layers of the hosing 10 as shown in FIG. 16, the sealing members 401 and 402 can be easily formed. Similarly, the terminal 401a and the first electrode 203 can be easily soldered together, and the terminal 401a and the second electrode 204 can be easily soldered together.

A comparative example will be described in which both the outermost layers of the housing 10 are formed of the high-temperature layer 103. When the outermost layers of the housing 10 are formed of the high-temperature layer 103, the following problems may occur. When the power generation apparatus 2 is used, the first electrode 203 and the second electrode 204 become hot by the high-temperature layer 103. As a result, selection of a material for each of the first electrode 203 and the second electrode 204 needs to take into account the adverse effect of metal diffusion or oxidation between the first thermoelectric material 201 and the first electrode 203 and between the second thermoelectric material 202 and the second electrode 204. Even if the sealing members 401 and 402 are provided on the respective opposite outermost layers of the housing 10 as shown in FIG. 16, materials need to be selected for the sealing members 401 and 402 with the durability of the materials taken into account. Similarly, the terminal 401a and the first electrode 203 cannot be easily soldered together, and the terminal 401a and the second electrode 204 cannot be easily soldered together. Therefore, it is effective to form the outermost layers of the housing 1 of the low-temperature layer 101.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A thermoelectric module comprising:
a housing comprising two first temperature layers and a second temperature layer, the first temperature layers and the second temperature layer being stacked, a temperature of the first temperature layers being higher or lower than a temperature of the second temperature layer, the housing further comprising a cylindrical through-hole provided so as to completely penetrate the first temperature layers and the second temperature layer; and
a power generation member comprising thermoelectric materials stacked such that current flows in one direction in the power generation member, the power generation member being provided in the through-hole, each of the thermoelectric materials comprising opposing planar end surfaces, wherein each opposing planar end surface is common to a respective plane, and each respective plane intersects only one temperature layer.

2. The thermoelectric module of claim 1, wherein the thermoelectric materials comprise a p-type semiconductor or an n-type semiconductor.

3. The thermoelectric module of claim 1, further comprising: a first heat insulating layer between the second temperature layer and one of the first temperature layers, and a second heat insulating layer between the second temperature layer and the other first temperature layer.

4. The thermoelectric module of claim 1, further comprising:

a soaking member of electrical and thermal conductive materials and arranged between the thermoelectric materials.

5. The thermoelectric module of claim 1, further comprising: a heat conductive member provided between each of the thermoelectric materials and one of the first temperature layers and/or the second temperature layer.

6. The thermoelectric module of claim 1, wherein the housing is formed of a conductive material and the power generation member and the housing are electrically insulated from each other.

7. The thermoelectric module of claim 1, wherein the through-hole and the power generation member have an identical taper.

8. The thermoelectric module of claim 1, further comprising: a current plate configured to direct a flow of a fluid toward the through-hole, wherein the fluid flows through one of the first temperature layers or the second temperature layer.

9. The thermoelectric module of claim 1, wherein the housing comprises at least one additional through-hole, wherein an additional power generation member is provided in each additional through-hole, and wherein all of the power generation members are connected together in series or in parallel.

10. The thermoelectric module of claim 5, further comprising:
a soaking member of electrical and thermal conductive materials and arranged between the thermoelectric materials and in contact with the heat conductive member.

11. The thermoelectric module of claim 10, wherein the conductive member internally comprises a through-hole.

12. The thermoelectric module of claim 11, wherein the soaking member is fixed to the heat conductive member.

13. The thermoelectric module of claim 11, wherein the housing is formed of a material with a smaller coefficient of thermal expansion than at least one of the heat conductive member and the power generation member.

14. The thermoelectric module of claim 11, further comprising: a film of a conductor provided between the heat conductive member and the housing, wherein the heat conductive member is formed of an insulating material.

15. The thermoelectric module of claim 11, further comprising: a film of an insulating material provided between the heat conductive member and the housing, wherein the heat conductive member is formed of a conductor.

16. The thermoelectric module of claim 11, further comprising: a film of an insulating material provided between the heat conductive member and the thermoelectric material, wherein the heat conductive member is formed of a conductor.

17. The thermoelectric module of claim 11, wherein the heat conductive member comprises a projection portion provided at a position where the heat conductive member contacts the soaking member and extending in a circumferential direction of the heat conductive member.

18. A power generation apparatus with the thermoelectric module of claim 1, the apparatus comprising:
a terminal configured to obtain power from the thermoelectric module, and wherein the through-hole is sealed in an air-tight manner.

* * * * *